US012597583B2

(12) United States Patent
Gledhill et al.

(10) Patent No.: US 12,597,583 B2
(45) Date of Patent: Apr. 7, 2026

(54) FIB AND SEM RESOLUTION ENHANCEMENT USING ASYMMETRIC PROBE DECONVOLUTION

(71) Applicant: FEI Company, Hillsboro, OR (US)

(72) Inventors: Galen Gledhill, Portland, OR (US); Alexander Henstra, Eindhoven (NL)

(73) Assignee: FEI Company, Hillsboro, OR (US)

( * ) Notice: Subject to any disclaimer, the term of this patent is extended or adjusted under 35 U.S.C. 154(b) by 355 days.

(21) Appl. No.: 18/357,056

(22) Filed: Jul. 21, 2023

(65) Prior Publication Data

US 2025/0029809 A1      Jan. 23, 2025

(51) Int. Cl.
| | |
|---|---|
| *H01J 37/22* | (2006.01) |
| *H01J 37/09* | (2006.01) |
| *H01J 37/147* | (2006.01) |
| *H01J 37/15* | (2006.01) |
| *H01J 37/28* | (2006.01) |

(52) U.S. Cl.
CPC ............ *H01J 37/222* (2013.01); *H01J 37/09* (2013.01); *H01J 37/1471* (2013.01); *H01J 37/15* (2013.01); *H01J 37/28* (2013.01)

(58) Field of Classification Search
CPC ........... G01N 23/04; G01N 2223/3301; G06T 3/4076; H01J 37/00; H01J 37/02; H01J 37/09; H01J 37/10; H01J 37/1471; H01J 37/15; H01J 37/20; H01J 37/222; H01J 37/244; H01J 37/26; H01J 37/265; H01J 37/28; H01J 37/3053; H01J 2237/0451; H01J 2237/153; H01J 2237/204; H01J 2237/221; H01J 2237/24542

USPC .......................................... 250/306, 307, 311
See application file for complete search history.

(56) References Cited

U.S. PATENT DOCUMENTS

| | | | | |
|---|---|---|---|---|
| 2003/0151002 A1* | 8/2003 | Ito | .......................... | G01N 23/04 |
| | | | | 250/492.1 |
| 2010/0081217 A1* | 4/2010 | Nagano | ................... | H01J 37/28 |
| | | | | 250/307 |
| 2018/0182067 A1* | 6/2018 | Liu | ....................... | G06T 3/4069 |
| 2020/0286709 A1* | 9/2020 | Shiratsuchi | ............. | H01J 37/22 |
| 2022/0317068 A1* | 10/2022 | Kaercher | ............... | G01N 23/04 |

OTHER PUBLICATIONS

Carasso et al., "APEX method and real-time blind deconvolution of scanning electron microscope imagery," Optical Engineering, 41(10):2499-2514 (Oct. 2002).
Extended Search Report for related Application No. EP 24189486.4, 11 pages, mailed Dec. 11, 2024.
Nevins et al., "Visualizing Astigmatism in the SEM Electron Probe," Microscopy and Microanalysis, 24(1):604-605 (Aug. 1, 2018).

(Continued)

*Primary Examiner* — Jason L McCormack

(57) ABSTRACT

Elongated or other non-circular charged-particle beams (CPBs) are used to produce substrate images that can be processed such as by deconvolution to produce a final image. In some cases, first and second images associated with an asymmetric CPB beams aligned along parallel axes are deconvolved and then combined to produce the final image or combined and then deconvolved to produce the final image. Milling or other processing can be performed by aligning an asymmetric CPB with respect to a CPB scan or processing direction.

20 Claims, 7 Drawing Sheets

(56)         References Cited

OTHER PUBLICATIONS

Zotta et al., "The Determination and Application of the Point Spread Function in the Scanning Electron Microscope," Microscopy and Microanalysis, 24(4):396-405 (Aug. 1, 2018).

Yano et al., "Deconvolution of scanning electron microscopy images," Scanning, 15 (1), pp. 19-24 (1993).

Dong et al., "Deep Wiener Deconvolution: Wiener Meets Deep Learning for Image Deblurring," arXiv:2013.099621 (Mar. 18, 20201), 12 pages.

* cited by examiner

```
┌─────────────────────┐      ┌──────────────────┐      ┌──────────────────┐
│ SELECT BEAM SHAPING │      │ PRODUCE CPB WITH │      │  OBTAIN IMAGE    │
│       METHOD        │ ───► │ ASYMMETRIC BEAM  │ ───► │     USING        │
│                     │      │     SHAPE        │      │   ASYMMETRIC     │
│      APERTURE       │      │      104         │      │   BEAM SHAPE     │
│ ANISOTROPIC MAG.    │      │                  │      │      105         │
│    ABERRATION       │      │                  │      │                  │
└─────────────────────┘      └──────────────────┘      └──────────────────┘
          102                      104
```

SELECT BEAM SHAPING METHOD

APERTURE ANISOTROPIC MAG. ABERRATION
102

PRODUCE CPB WITH ASYMMETRIC BEAM SHAPE 104

OBTAIN IMAGE USING ASYMMETRIC BEAM SHAPE 105

MEASURE OR ESTIMATE CPB SHAPE

MEASURE CPB SHAPE?

SELECT DECONVOLUTION APPROACH

WIENER RICHARDSON-LUCY

. . .

1D/2D 112     108     106

DECONVOLVE BASED ON CPB SHAPE 114

OBTAIN STORED OR COMPUTED CPB SHAPE 110

FIG. 1A

RECONSTRUCTED IMAGE 116

PROCESS WORKPIECE WITH ALIGNED CPB 118

100

FIG. 1A1

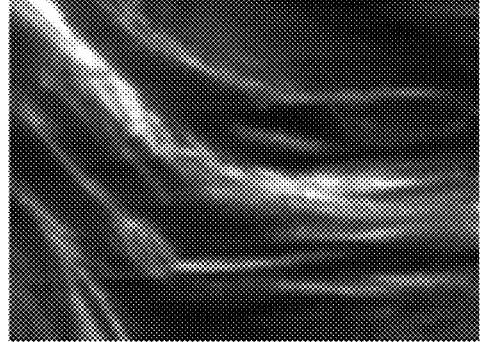

FIG. 1A2

FIG. 1A3
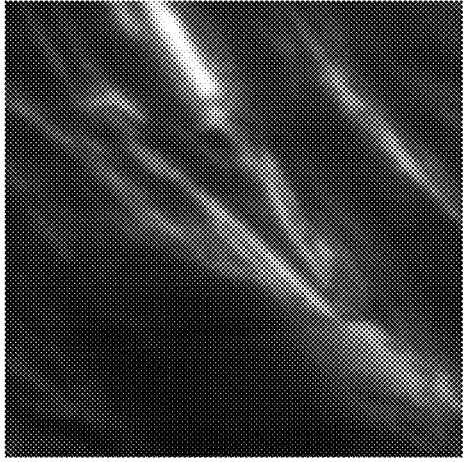
FIG. 1A4
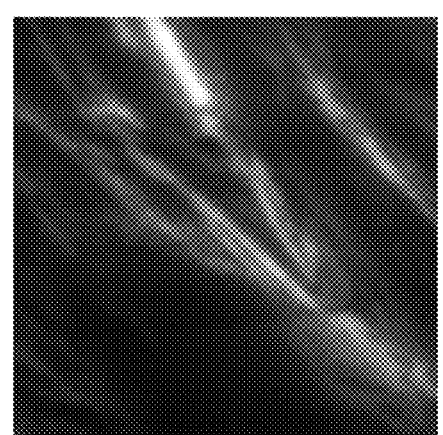
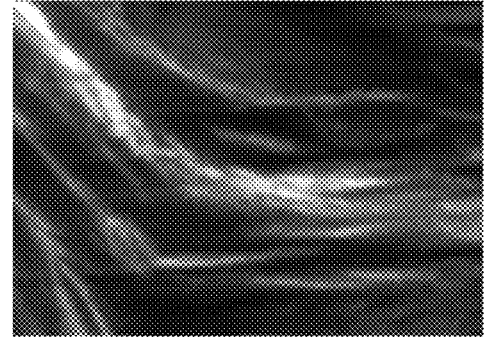
FIG. 1A5
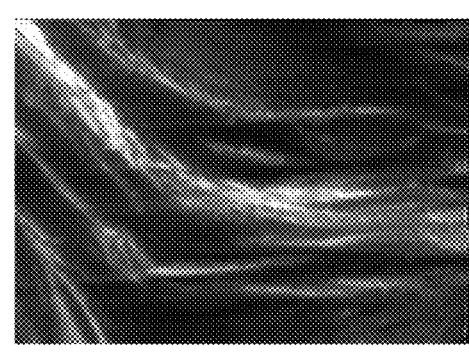
FIG. 1A6

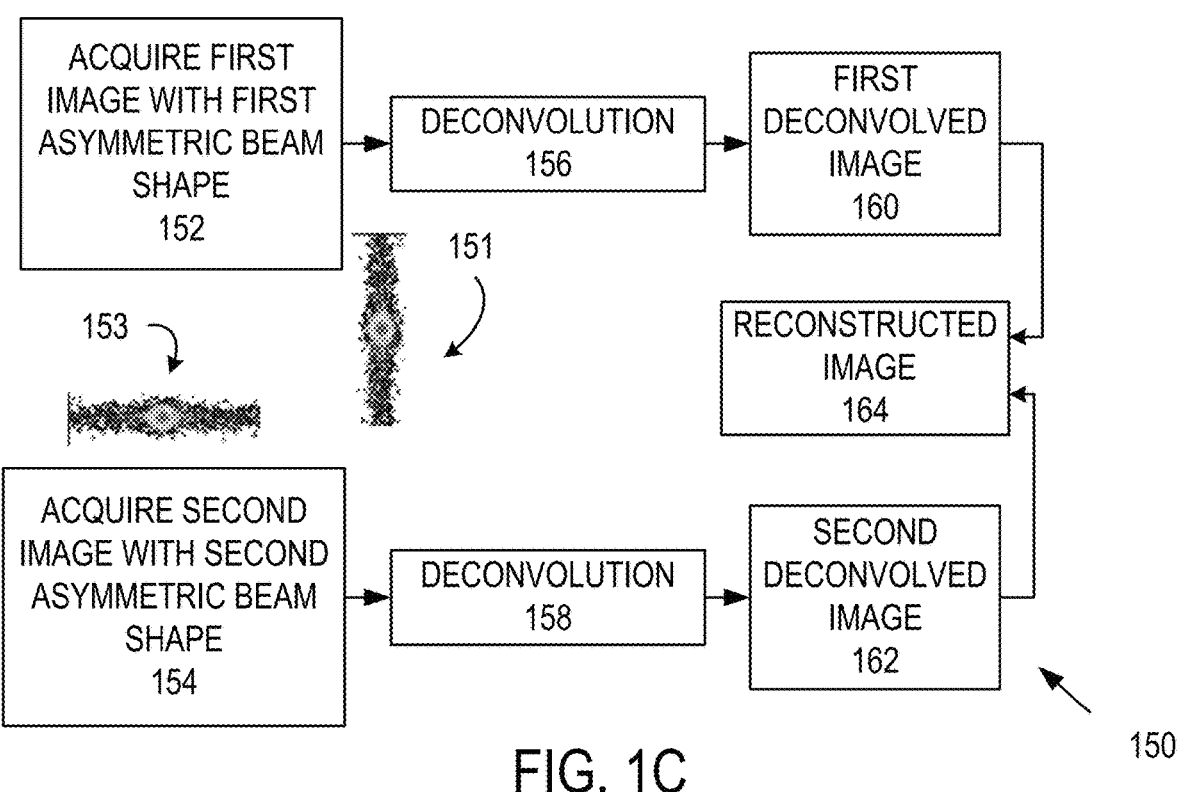
FIG. 1C
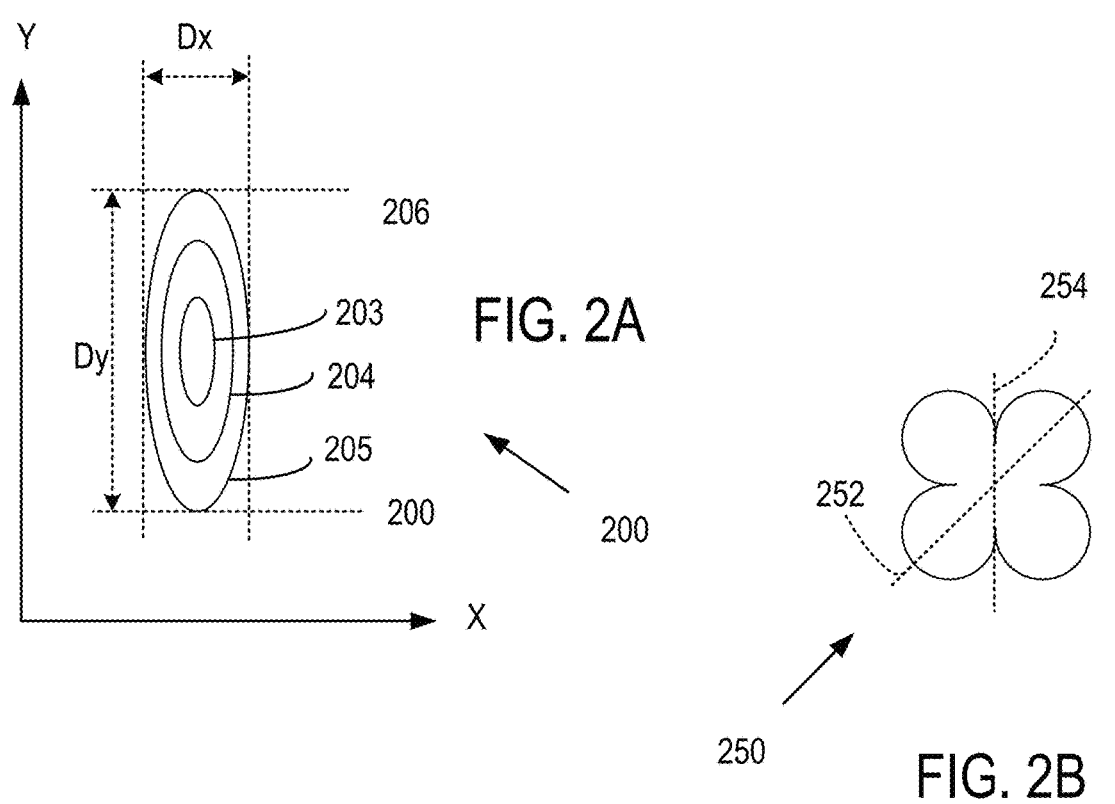
FIG. 2A
FIG. 2B

FIB AND SEM RESOLUTION ENHANCEMENT USING ASYMMETRIC PROBE DECONVOLUTION

FIELD

The disclosure pertains to the use of asymmetric beams in charged-particle beam systems.

BACKGROUND

Resolution is a key performance metric of charged-particle beam (CPB) optical systems such as electron microscopes and focused ion beam (FIB) milling systems. Conventional approaches require reducing CPB optical column lens aberrations or adding aberration correction elements. These approaches can be difficult to implement and may require a technician. Even if successfully implemented, additional improvements in resolution remain desirable. Thus, improved CPB methods and apparatus are desired that can enhance CPB instrument resolution.

SUMMARY

Disclosed herein are methods, apparatus, and systems that can create high resolution images in CPB imaging and improve cut-placement when used in combination with asymmetric beam CPB milling. By contrast to conventional methods that focus on providing aberration correction and symmetric CPBs, the present disclosure concerns use of one or more asymmetric CPB shapes, compensating images obtained with asymmetric beam shapes to enhance resolution, and processing substrates using the asymmetric CPB shapes.

The foregoing and other features, and advantages of the disclosed technology will become more apparent from the following detailed description, which proceeds with reference to the accompanying figures.

BRIEF DESCRIPTION OF THE DRAWINGS

FIG. 1A illustrates a representative imaging or method using an asymmetric charged particle beam (CPB) shape.

FIGS. 1A1-1A2 are images obtained with a round CPB shape and an elongated CPB shape, respectively.

FIG. 1A3 is an image obtained with an asymmetric CPB shape.

FIG. 1A4 is an image obtained by Wiener deconvolution of the image of FIG. 1A3.

FIG. 1A5 is an image obtained with an asymmetric CPB shape using a 2.3 nA Ga ion beam current and a 20 μm horizontal field of view.

FIG. 1A6 is an image obtained by Richardson-Lucy deconvolution of the image of FIG. 1A5.

FIG. 1C illustrates a representative imaging method using asymmetric charged particle beams having different orientations in which images are combined after deconvolution.

FIGS. 2A-2B illustrate representative asymmetric beam shapes. FIG. 2A illustrates an elongated shape such as an oval or ellipse in which smallest and largest beam dimensions are along orthogonal axes. FIG. 2B illustrates an asymmetric beam shape in which smallest and largest beam dimensions are along non-orthogonal axes.

FIG. 3 illustrates a representative dual beam CPB system that can provide asymmetric CPBs and deconvolve images obtained with such CPBs.

FIG. 4 illustrates a representative processor-based control system for use in acquiring and deconvolving images obtained with asymmetric CPB shapes and control of workpiece processing using an asymmetric CPB shape.

FIG. 5 illustrates orientations of an asymmetric CPB with respect to a workpiece for substrate processing such as focusing ion beam (FIB) milling.

FIG. 6 illustrates a workpiece that is provided with a predetermined pattern region that can used in deconvolution.

DETAILED DESCRIPTION

Figure 1B:
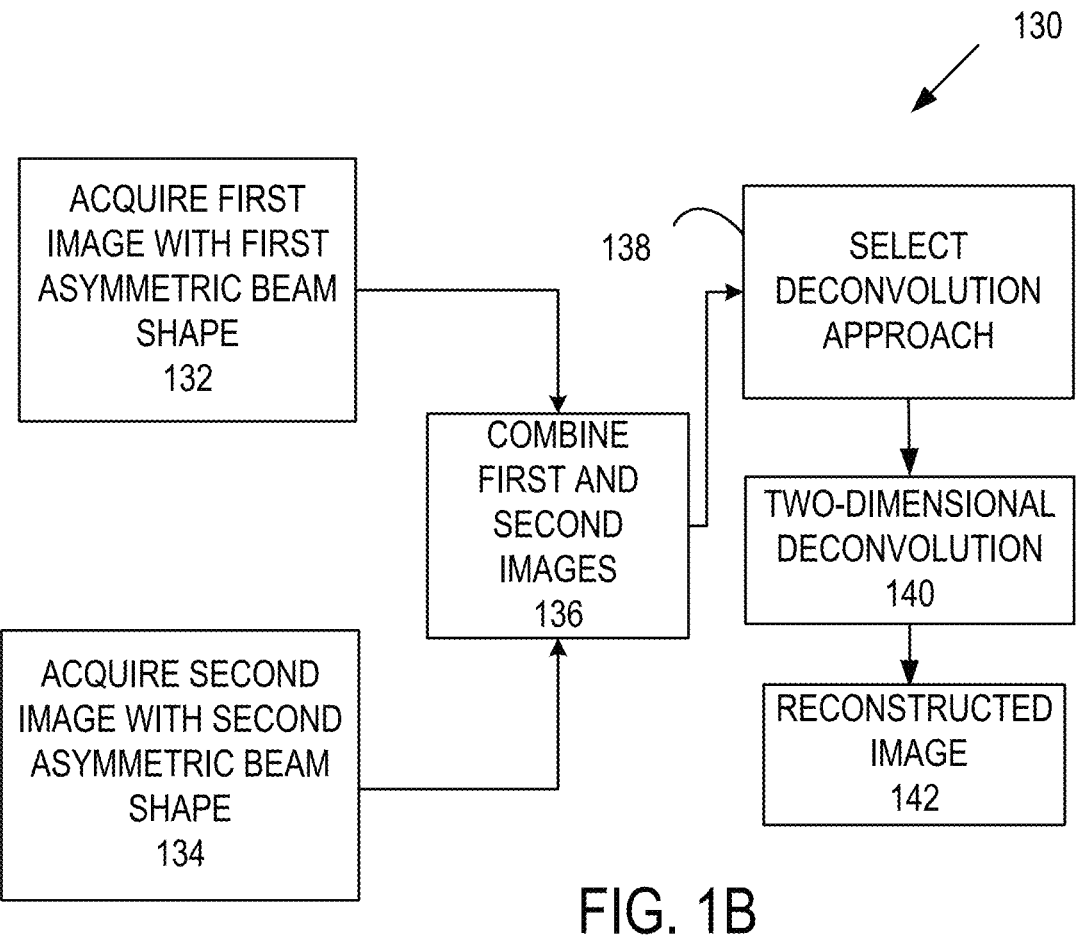
FIG. 1B illustrates a representative imaging method using asymmetric charged particle beams having different orientations in which images are combined prior to deconvolution.

Disclosed herein are methods and systems that use asymmetric charged-particle-beam (CPB) spots in combination with deconvolution to improve image resolution, and typically produce resolutions higher than would be achieved with a round beam using the same optical system. In some applications, asymmetric CPBs can provide increased sharpness for FIB milling. Extending such improvements to imaging is possible with the combination of probe deconvolution and image processing.

General Terminology and Considerations

As used herein, optical column refers generally to CPB lenses, deflectors, stigmators, and other CPB optical elements used in imaging or beam forming. In dual beam CPB instruments such as ion beam/electron beam systems, some or all optical column elements can be used with both beams or some or all optical column elements can be different. Representative CPB systems that include the disclosed approaches include dual beam systems that include an ion beam system for ion beam milling and an SEM system for evaluating sample, stand-along SEM or ion beam systems, and STEM.

As used herein, image refers to image data stored in various formats such as JPG, TIFF, BMP or other formats or a displayed view of a specimen such as presented on a display device or other visual display. For convenient description in the examples below, representations as one-dimensional or two-dimensional arrays are generally used.

A probe beam refers to a CPB directed to a specimen, typically for one or both of imaging and processing such as CPB milling. As used herein a CPB shape at a workpiece corresponds to beam intensity as a function of position at a workpiece or other substrate, i.e., $I(x,y)$, wherein $x$, $y$ are coordinates substantially orthogonal to a CPB direction of propagation. Beam intensity typically refers to beam current/area but for the applications disclosure herein, beam intensity can refer to dose/area. In the examples describe herein, CPB spots are generally asymmetric. As used herein, CPB shape is referred to as asymmetric if not substantially circular, such that a ratio of a maximum CPB size along a first axis to a minimum CPB size along a second axis that is different from the first axis is greater than 1.25, 1.5, 1.75, 2.0, 2.5, 3.0, 4, 5, or more. In a typical example, two asymmetric CPB shapes (elongated shapes) are used with maximum and minimum sizes along orthogonal directions. Examples are generally presented with reference to one or more elongated CPB shapes such as oval shapes, but the disclosed approaches can be applied to arbitrary CPB shapes. It will be appreciated that asymmetric CPBs as used herein can exhibit various rotational symmetries.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description some-times uses terms like "produce" and "provide" to describe the disclosed methods. These terms are high-level abstractions of the actual operations that are performed. The actual operations that correspond to these terms will vary depend-ing on the particular implementation and are readily dis-cernible by one of ordinary skill in the art.

In some examples, values, procedures, or apparatus are referred to as "lowest, "best," "minimum," or the like. It will be appreciated that such descriptions are intended to indicate that a selection among many used functional alternatives can be made, and such selections need not be better, smaller, or otherwise preferable to other selections.

Examples are described with reference to directions indi-cated as "above," "below," "upper," "lower," and the like. These terms are used for convenient description, but do not imply any particular spatial orientation.

Various techniques are available for deconvolution, including, for example, Wiener deconvolution, Richardson-Lucy deconvolution, Maximum Likelihood deconvolution, deep learning deconvolution, or other computer vison approaches. Deconvolution can be blind or use a known CPB shape. As discussed below, image processing can be used to correct or compensate CPB shape and produce a higher-resolution image. Single images or multiple images with different CPB orientations can be used for this correc-tion.

Example 1. Asymmetric Beam Imaging

Referring to FIG. 1A, a representative method 100 includes selecting a beam shaping method at 102. Typical examples of beam shaping include beam shaping with an asymmetric aperture, anisotropic beam magnification, intro-duction of aberrations based on adjustment of an optical column and disabling aberration compensation to provide an asymmetric CPB. At 104, using the selected method, a CPB with an asymmetric shape is produced and an asymmetric CPB is directed to a sample or workpiece. Based on irra-diation with the asymmetric beam spot, an image of the workpiece is obtained at 105 by, for example, SEM or STEM (for electron beams) or by similar imaging approaches using other CPBs such as ion beams. At 106, a deconvolution method is selected for image processing. At 108, it is determined if a CPB shape is to be measured or otherwise estimated for use in deconvolution. In some cases, a CPB shape is known or can be derived from, for example, properties of a CPB optical column and/or of voltages and currents applied to the optical column. In this case, CPB shape can be retrieved from a memory or computed at 110. Alternatively, a CPB shape can be measured at 112. Using CPB shape, the acquired image is deconvolved at 114 and a reconstructed image obtained at 116. In some examples, a workpiece is processed at 118. Processing can be accom-plished with the asymmetric CPB suitably aligned based on its differing extents in different directions.

FIGS. 1A1-1A2 show an image obtained using a sym-metric CPB (round beam shape) (FIG. 1A1) and an image obtained using an elongated asymmetric CPB (FIG. 1A2). The image of FIG. 1A2 is sharper than that of FIG. 1A1 with equivalent currents. The image of FIG. 1A2 can be further enhanced by deconvolution. These images are images of graphite and were obtained with a 2.5 nA beam current produced by a liquid metal ion source (LMIS) in an FIB instrument in a 5 μm horizontal field of view.

Figure 3:
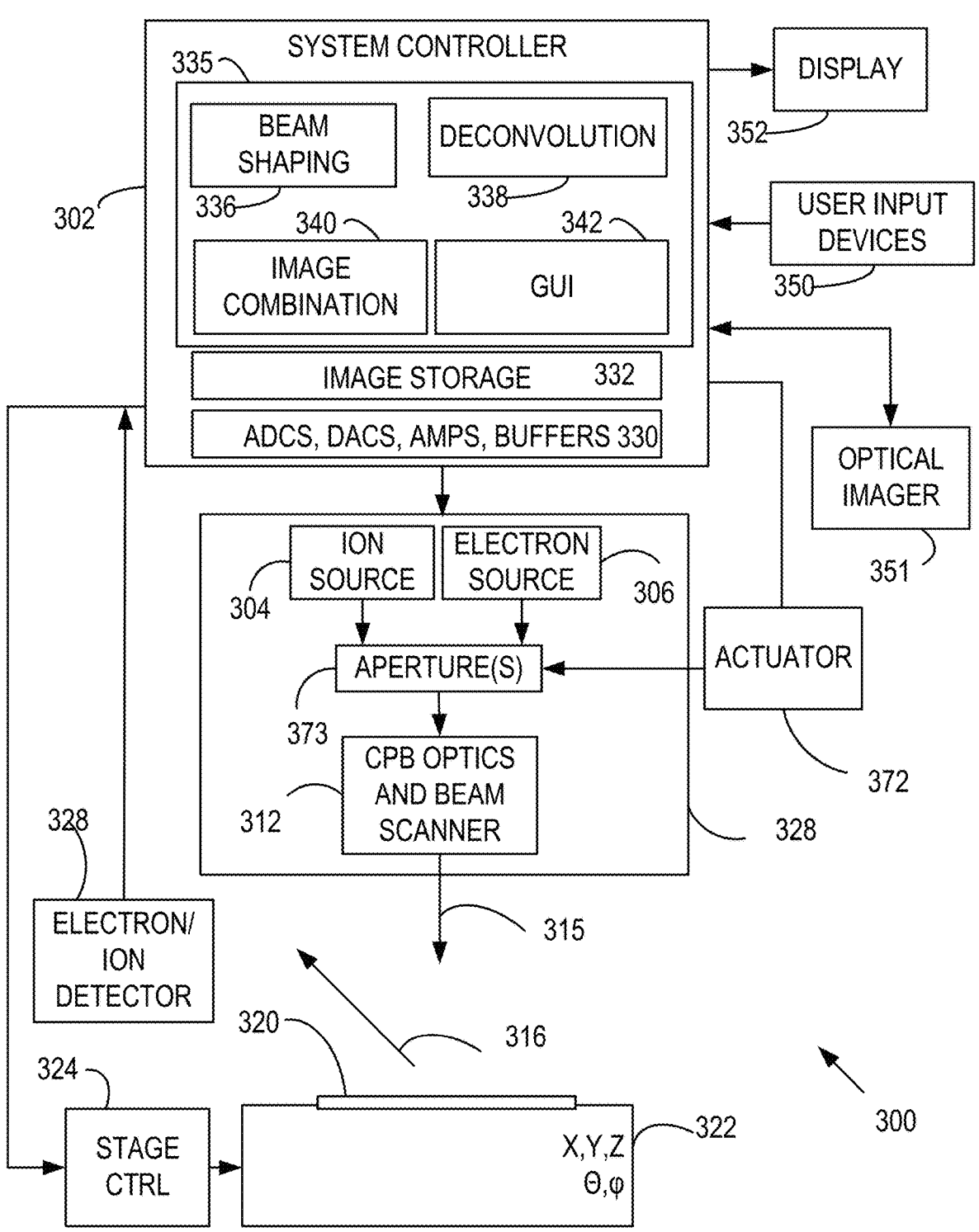
Figure 4:
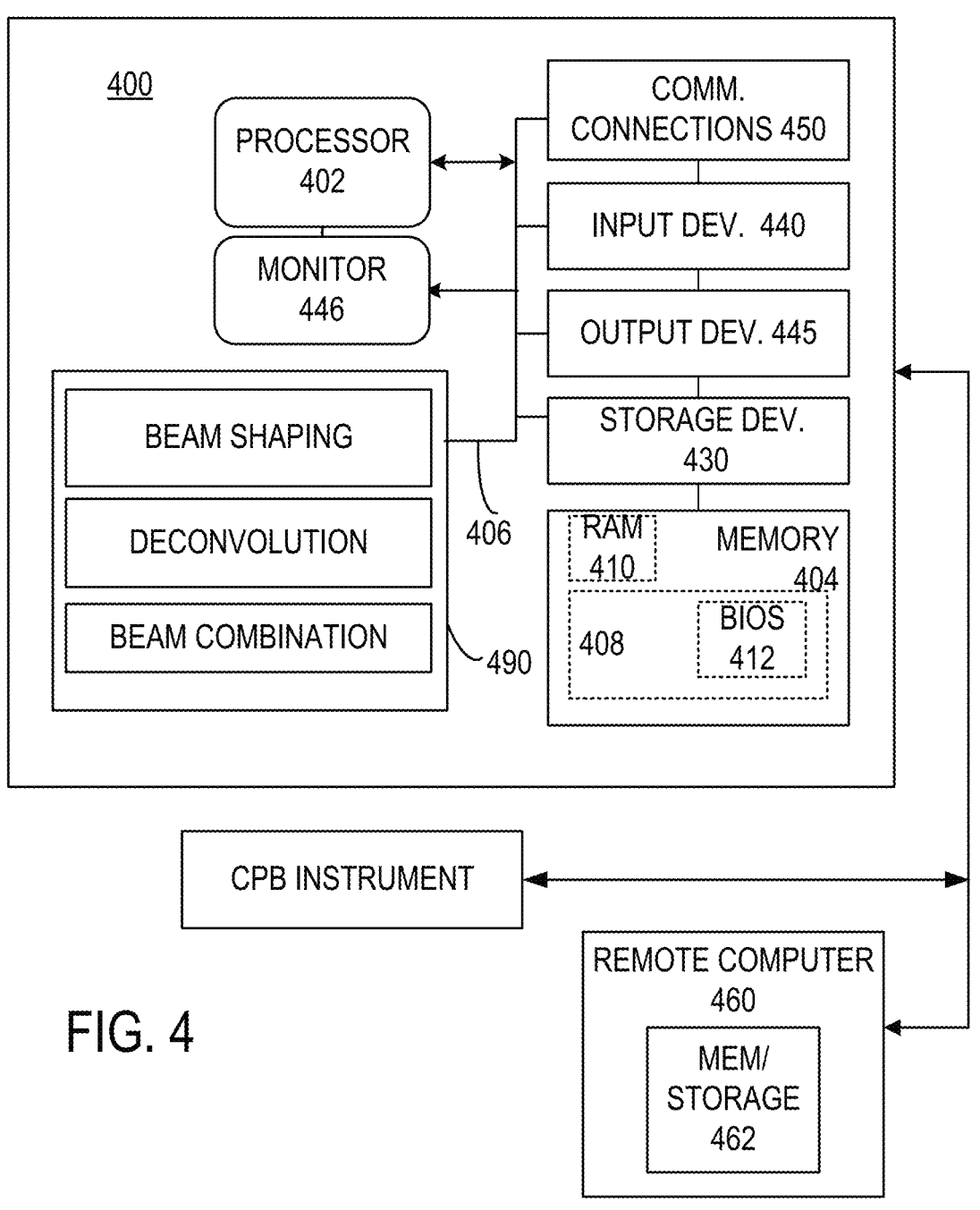
Figure 5:
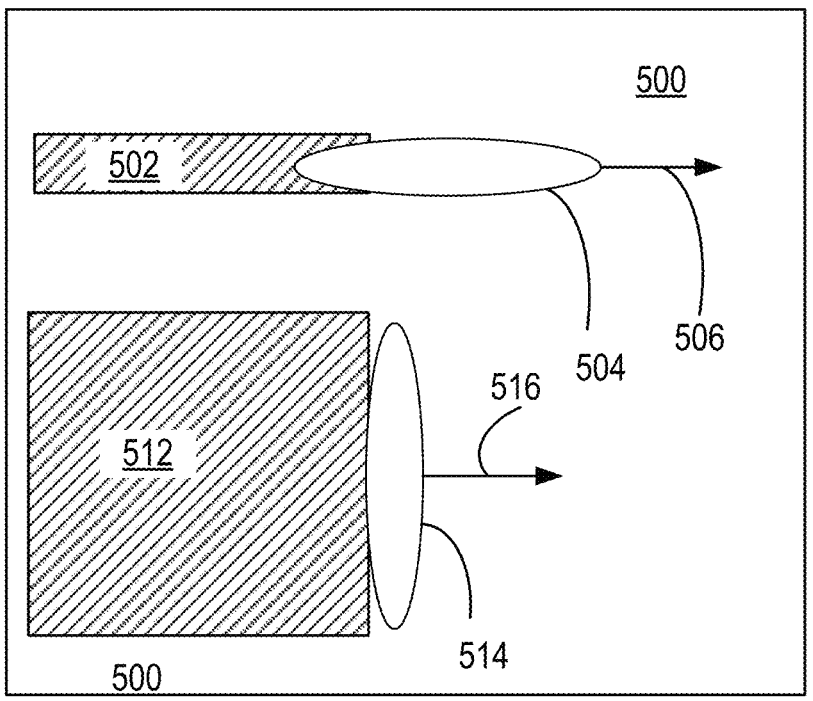
Figure 6:
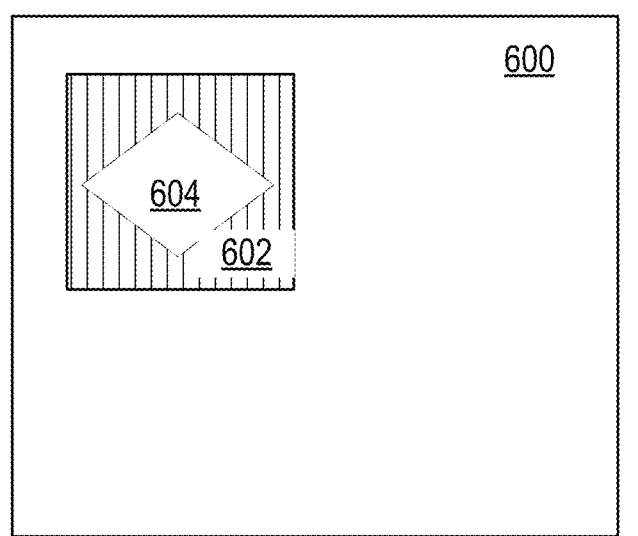

Original (elongated beam) images are shown in FIGS. 1A3 and 1A5 and corresponding deconvolved images are shown in FIGS. 1A4 and 1A6, respectively, in which Wiener deconvolution (FIG. 1A4) and Richardson-Lucy deconvo-lution (FIG. 1A6) are used.

Example 2. Asymmetric Beams and Two-Dimensional Deconvolution

Referring to FIG. 1B, a representative method 130 includes acquiring first image with a first asymmetric CPB shape at 132 and acquiring second image with a second asymmetric CPB shape at 134. In this example, the first and second asymmetric CPB shapes are selected to be orthogo-nal. The first and second images are combined at 136. A deconvolution method is selected at 138 and a two-dimen-sional deconvolution is applied at 140. With orthogonal CPB shapes selected so that one-dimensional deconvolution is suitable for the first and second images independently, the combined image can be deconvolved in a single two-dimensional deconvolution. A reconstructed image pro-duced by the two-dimensional deconvolution is stored at 142.

Example 3. Asymmetric Beam Imaging with Multiple CPB Shapes

In another example illustrated in FIG. 1C, an imaging method 150 includes acquiring a first image with a first asymmetric CPB shape 151 at 152 and a second image with a second asymmetric CPB shape 153 at 154. The first image and the second image are deconvolved at 156, 158 based on the first and second asymmetric CPB shapes, respectively, to produce a first deconvolved image at 160 and a second deconvolved image at 162. The deconvolved images are combined at 164 to produce a reconstructed image at 164.

While FIG. 1C illustrates the use of two CPB shapes 151, 153 that are elongated along orthogonal axes, multiple CPB shapes can be used with arbitrary orientations. While typi-cally deconvolution is applied to enhance an image based on a longer dimension of an asymmetric beam shape, decon-volution can be applied to enhance image in two directions as well. With asymmetric CPBs, workpiece processing typically requires alignment of beam asymmetry with respect to a workpiece. For example, in milling a groove, a longer dimension of an asymmetric CPB can be aligned with the groove direction so that groove widths can be obtained based on CPB shape in the shorter dimension.

While the method 100 uses measurement of asymmetric beam shape in deconvolution, the methods 130, 150 of FIGS. 1B-1C do not show use of this beam shape. In any of the above examples, deconvolution can be based on beam shape corresponding to a known or estimated point spread function (PSF) or so-called "blind" deconvolution used with limited or no use of data concerning a PSF associated with the asymmetric beam. These blind methods can be iterative (for example, maximum a posteriori or expectation-maximation approaches) or non-iterative. In some of these approaches, an estimate of the PSF is helpful, although not required. In using a two-dimensional deconvolution based on a sum of images obtained with orthogonal, elongated beams, a PSF is assumed to be separable, i.e., to operated independently along the associated elongated bean axes.

Example 4. Representative Beam Shapes

With reference to FIG. 2, a representative beam shape 200 at a workpiece is illustrated with respect to an XY-coordinate system that is aligned with longest and shortest dimensions of the beam shape 200. Ovals 203-205 correspond to beam intensities (currents/area) of 75%, 50%, and 25% of a maximum intensity at beam center. For convenience, beam widths are defined as full widths to 25% of maximum and are indicated as Dx and Dy in FIG. 2. Other values can be selected such as full or half-widths to 50%, 33%. 1/e, 1e$^2$, wherein e is Euler's number. Beam shapes associated with elongated beams a shown in FIG. 2 are referred to herein as asymmetric if a ratio of a longest dimension to a narrowest dimension (Dy/Dx) is greater than 1.25, 1.5, 1.75, 2.0, 2.5, 3.0, 4, 5. More complex asymmetric CPB shapes can also be used such as shapes in which longest and shortest dimensions are not orthogonal such as the beam shape 250 of FIG. 2B in which longest and shortest dimensions are along non-orthogonal axes 252, 254.

Example 5. Dual Beam System with Asymmetric Beam(s)

Referring to FIG. 3, a dual beam system 300 includes a system controller 302 that is coupled to an ion beam source 304 and an electron beam source 306 that produce an ion beam and an electron beam respectively, that can be shaped by one or more apertures 373 that are selectable by the system controller 302. In some implementations, separate actuators and apertures are provided for independently shaping an ion beam and an electron beam. An optical column 312 is situated to receive the ion beam and the electron beam to direct the beams to a workpiece or specimen 320. Typically, the optical column 312 includes an objective lens that focuses one or both of the ion beam and the electron beam at the workpiece 320. In addition, the optical column 312 can include one or more scanners that direct one or both of the beams across the workpiece 320. In dual-beam implementations such as an ion beam/electron beam systems, separate optical columns and objective lenses are provided. In some applications, images are obtained based on the scanned electron beam and the scanned ion beam is used for specimen modification such as ion beam milling. However, images can be obtained with either one or both of the scanned ion beam and the scanned electron beam. In some cases, an imaging system includes only one of an electron beam source and an ion beam source. For many biological specimens, only an electron beam is required, and ion beam components are not used. Scanned beams can be shaped to be asymmetric with control of the optical column 312 by, for example, control of one or more CPB lenses, stigmators, deflectors, and other CPB optical elements.

The specimen 320 is secured to a stage 322 that is coupled to a stage controller 324 that is in turn coupled to the system controller 302. The stage 322 generally can provide one or more translations, rotations, or tilts as directed by the system controller 302. A beam 316 responsive to a scanned beam 315 (such as an ion beam or an electron beam) is directed to an electron or ion detector 328 which is coupled to system electronics 330 which can include one or more analog-to-digital convertors (ADCs), digital to analog-convertors (DACs), amplifiers, and buffers for control of the detector 328 and processing (amplification, digitization, buffering) of signals associated with the detector 328. The scanned beam 315 is shown as incident perpendicularly to the specimen 320, but in many cases, such beams can be directed at angles of incidence of 60 degrees or more. In other examples, a photon detector is used that produces an electrical signal that is further processed by the system electronics. In most practical examples, at least one ADC is used to produce a digitized detector signal that can be stored in one or more tangible computer readable media (shown as image storage 332) as an image. In other examples, image storage is remote via a communication connection such as a wired or wireless network connection. The beam 316 can be scattered portions of the scanned ion beam, the scanned electron beam, secondary electrons, ions, or neutral atoms. An optical imager 351 such as a camera is coupled to produce an image of the specimen 320 to, for example, provide visual feedback to a technician.

The system controller 302 is coupled to a memory 335 that stores processor-executable instructions for image processing and acquisition such as beam shaping 336 to produce asymmetric CPBs by suitable control of the optical column 312, deconvolution 338, image combination 340 (which can be provided before or after deconvolution) and to provide a graphical user interface (GUI) 342 for various functions, including parameters associated with selection of asymmetric beam shapes. In addition, the system controller 302 is coupled to an actuator 372 that is operable to select one or more apertures 373 in a beam path for beam shaping. Images (both CPB and optical) can be stored in a memory portion 332. Stage coordinates (including rotations) can be stored in memory portion 332 as well. The system controller 302 establishes image acquisition parameters and is in communication with the stage controller 324. Specimen images such as deconvolved images can be presented on a display 352, and system control and imaging parameters can be specified using internally stored values from the memory 335 or provided by a user with one or more user input devices 350.

It will be appreciated that the layout of FIG. 3 is for convenient illustration, and actual alignments of various beam sources, the optical column 312, and other components need not be the same as shown. Components used to establish a suitable vacuum environment are omitted as well. While a dual beam (ion/electron beam) system is illustrated, one or both beams can be used, and in many practical examples such as electron microscopy, only an electron beam is used.

Example 6. Representative Computing Environment for System Control

FIG. 4 and the following discussion are intended to provide a brief, general description of an exemplary computing environment in which the disclosed technology may be implemented. In particular, some or all portions of this computing environment can be used with the above methods and apparatus to, for example, to control beam shape, acquire images with multiple beam shapes, and select deconvolution approaches. Although not required, the disclosed technology is described in the general context of computer executable instructions, such as program modules, being executed by a personal computer (PC). Generally, program modules include routines, programs, objects, components, data structures, etc., that perform particular tasks or implement particular abstract data types. Moreover, the disclosed technology may be implemented with other computer system configurations, including handheld devices, tablets, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network. In a distributed computing environment, program modules may be located in both local and remote memory storage devices. As used herein, the term "processor" refers to CPUs and other logical processing devices such as FPGAs, ASICs, and CPLDs. A system controller or other controller generally includes at least one processor as well as additional components such as memory, communication buses, and others as discussed below.

With reference to FIG. 4, an exemplary system for implementing the disclosed technology includes a general-purpose computing device in the form of an exemplary conventional PC 400 that includes one or more processors 402, a system memory 404, and a system bus 406 that couples various system components including the system memory 404 to the one or more processors 402. The system bus 406 may be any of several types of bus structures including a memory bus or memory controller, a peripheral bus, and a local bus using any of a variety of bus architectures. The exemplary system memory 404 includes read only memory (ROM) 408 and random-access memory (RAM) 410. A basic input/output system (BIOS) 412, containing the basic routines that help with the transfer of information between elements within the PC 400, is stored in ROM 408.

The exemplary PC 400 further includes one or more storage devices 430 such as a hard disk drive for reading from and writing to a hard disk, a magnetic disk drive for reading from or writing to a removable magnetic disk, a memory device such as a thumb drive, and an optical disk drive for reading from or writing to a removable optical disk (such as a CD-ROM or other optical media). Such storage devices can be connected to the system bus 406 by a hard disk drive interface, a magnetic disk drive interface, and an optical drive interface, respectively. The drives and their associated computer readable media provide nonvolatile storage of computer-readable instructions, data structures, program modules, and other data for the PC 400. Other types of computer-readable media which can store data that is accessible by a PC, such as magnetic cassettes, flash memory cards, digital video disks, CDs, DVDs, RAMS, ROMs, and the like, may also be used in the exemplary operating environment. As used herein, memory, storage devices and the like refer to non-transitory storage, i.e., not propagating signals.

A number of program modules may be stored in the storage devices 430 including an operating system, one or more application programs, other program modules, and program data. A user may enter commands and information into the PC 400 through one or more input devices 440 such as a keyboard and a pointing device such as a mouse. For example, the user may enter commands to select CPB shape and deconvolution approach. Other input devices may include a digital camera, microphone, joystick, game pad, satellite dish, scanner, or the like. These and other input devices are often connected to the one or more processing units 402 through a serial port interface that is coupled to the system bus 406 but may be connected by other interfaces such as a parallel port, game port, universal serial bus (USB), or wired or wireless network connection. A monitor 446 or other type of display device is also connected to the system bus 406 via an interface, such as a video adapter, and can display, for example, one or ROI images obtained with an asymmetric CPB shape or processed images obtained by deconvolution. The monitor 446 can also be used to aid in CPB instrument control, to confirm successful beams shape control, image acquisition, and selection of deconvolution approach, and other functions. Other peripheral output devices, such as speakers and printers (not shown), may be included.

The PC 400 may operate in a networked environment using logical connections to one or more remote computers, such as a remote computer 460. In some examples, one or more network or communication connections 450 are included. The remote computer 460 may be another PC, a server, a router, a network PC, or a peer device or other common network node, and typically includes many or all of the elements described above relative to the PC 400, although only a memory storage device 462 has been illustrated in FIG. 4. The personal computer 400 and/or the remote computer 460 can be connected to a logical a local area network (LAN) and a wide area network (WAN). Some or all functions provided by the PC 400 can be provided by the remote computer 460.

As shown in FIG. 4, a memory 490 (or portions of this or other memory) stores processor executable instructions for deconvolution, beam combination, and beam shaping. In addition, the memory 490 can store images, beam characteristics for use in deconvolution, and a menu of beam shape settings that permits CPB shape to be easily set to control a CPB instrument 492.

Example 7. FIB Processing with Elongated Asymmetric Beam Shape

In using asymmetric CPBs, beam orientation can be selected based on processing features such as features to be milled. FIG. 5 illustrates processing of a workpiece 500 with an ion beam to form grooves 502, 512 using a common beam shape but aligned in different directions. The groove 502 is milled with a beam shape 504 that is aligned with a longest dimension along the groove 502. The groove 512 is milled with a beam shape 514 that is aligned with a shortest dimension along the groove 512. In milling the grooves 502, 512, the differently aligned beams are scanned along parallel axes 506, 516.

Example 8. Image Combining

As noted above, images obtained with different beam shapes and/or orientations can be combined before or after deconvolution. Images can be combined by adding image values pixel-by-pixel. In some cases, the different images are scaled to have pixel values in a common range. For example, pixel values in each image can be scaled based on a maximum pixel value so that both images have pixel values between 0 and 1. Different weighting factors can be applied to the images to select the individual image contributions to a combined image.

Example 9. Deconvolution with Predetermined Pattern

In an example shown in FIG. 6, a region of interest 600 that is to be imaged and/or CPB processed is provided with a predetermined pattern region 602. The patterned region 602 includes at least one feature such as feature 604. An image of the ROI 600 obtained with an asymmetric CPB contains a corresponding image portion that can be used in deconvolution as a suitable image reconstruction tends to reproduce the associated pattern. Thus, the pattern region 602 can be used to guide and evaluate deconvolution. In some cases, a fiducial pattern defined on a workpiece is available and can serve to guide deconvolution.

Disclosure Paragraphs

Paragraph 1 is a charged-particle beam (CPB) imaging method, including: obtaining an image of a sample, wherein the image is obtained with a first asymmetric CPB shape; and processing the image based on the first asymmetric CPB shape to produce a final image of the sample.

Paragraph 2 includes the subject matter of Paragraph 1, and further specifies that the first asymmetric CPB shape is an elongated shape, and the image is processed based on the first asymmetric CPB shape by deconvolution.

Paragraph 3 includes the subject matter of any of Paragraphs 1-2, and further includes operating a CPB optical column to select the first asymmetric CPB shape.

Paragraph 4 includes the subject matter of any of Paragraphs 1-3, and further specifies that the first asymmetric CPB shape is selected by one or more of directing a CPB beam to an asymmetric aperture, providing different CPB magnifications along different axes, and adjusting the CPB optical column to provide differing chromatic aberrations along different axes.

Paragraph 5 includes the subject matter of any of Paragraphs 1-4, and further specifies that the obtaining the image comprises obtaining a first image and a second image of a sample, wherein the first image and the second image are obtained with the first asymmetric CPB shape and a second asymmetric CPB shape, respectively, wherein the first asymmetric CPB shape is different from the second asymmetric CPB shape, and wherein the final image is obtained by processing the first image and the second image.

Paragraph 6 includes the subject matter of any of Paragraphs 1-5, and further includes:

deconvolving the first image based on the first asymmetric CPB shape; and deconvolving the second image based on the second asymmetric CPB shape, wherein the final image is produced based on the deconvolved first image and the deconvolved second image.

Paragraph 7 includes the subject matter of any of Paragraphs 1-6, and further includes:

combining the first image and the second image; and deconvolving the combined image to produce the final image.

Paragraph 8 includes the subject matter of any of Paragraphs 1-7, and further specifies that the first asymmetric CPB shape is aligned along a first axis and the second asymmetric CPB shape is aligned along a second axis that is different from the first axis.

Paragraph 9 includes the subject matter of any of Paragraphs 1-8, and further specifies that the first axis and the second axis are orthogonal.

Paragraph 10 includes the subject matter of any of Paragraphs 1-9, and further specifies that the first axis is at an angle of between 45 degrees and 90 degrees with respect to the second axis.

Paragraph 11 includes the subject matter of any of Paragraphs 1-10, and further includes adjusting a CPB optical column to produce the first asymmetric CPB shape and the second asymmetric CPB shape.

Paragraph 12 includes the subject matter of any of Paragraphs 1-11, and further includes: obtaining a third image of the sample, wherein the third image is obtained with a third beam shape that is different from the first asymmetric CPB shape and the second asymmetric CPB beam shape; and deconvolving the first, second, and third images and producing the final image based on the deconvolved first, second, and third images.

Paragraph 13 is a CPB imaging system, including: a CPB optical column operable to produce a first asymmetric CPB that is alignable along a first axis; a CPB detector situated to produce a first image responsive to the first asymmetric CPB, respectively; and a processor coupled to produce a final image based on the first image.

Paragraph 14 includes the subject matter of Paragraph 13, and further specifies that the processor is configured to produce the final image from the first image and shape of the first asymmetric CPB.

Paragraph 15 includes the subject matter of any of Paragraphs 13-14, and further specifies that the processor is operable to produce the final image by deconvolution.

Paragraph 16 includes the subject matter of any of Paragraphs 13-16, and further specifies that: the CPB optical column is operable to produce the first asymmetric CPB and a second asymmetric CPB that are alignable along the first axis and a second axis, respectively, wherein the first axis is different from the second axis; the CPB detector is situated to produce the first image and a second image of a substrate responsive to the first asymmetric CPB and the second asymmetric CPB, respectively; and the processor is to produce a final image based on the first image and the second image.

Paragraph 17 includes the subject matter of any of Paragraphs 13-16, and further specifies that the processor is configured to produce the final image based on deconvolution.

Paragraph 18 includes the subject matter of any of Paragraphs 13-17 and further specifies that the deconvolution is based on based on respective shapes of the first asymmetric CPB and the second asymmetric CPB.

Paragraph 19 includes the subject matter of any of Paragraphs 13-18 and further specifies that the processor is operable to combine a deconvolved first image and a deconvolved second image to produce a final image.

Paragraph 20 includes the subject matter of any of Paragraphs 13-19, further specifies that first asymmetric CPB beam is an elongated beam, and the processor is further configured scan the first CPB at a substrate along a direction parallel to a direction of elongation of the first asymmetric CPB.

In view of the many possible embodiments to which the principles of the disclosed technology may be applied, it should be recognized that the illustrated embodiments are only preferred examples. We claim all that comes within the scope and spirit of the appended claims.

We claim:

1. A charged-particle beam (CPB) imaging method, comprising:
   obtaining an image of a sample, wherein the image is obtained with a first asymmetric CPB shape that is selected by providing different CPB magnification along different axes; and
   processing the image based on the first asymmetric CPB shape to produce a final image of the sample.

2. The CPB imaging method of claim 1, wherein the first asymmetric CPB shape is an elongated shape, and the image is processed based on the first asymmetric CPB shape by deconvolution.

3. The CPB imaging method of claim 1, further comprising operating a CPB optical column to select the first asymmetric CPB shape.

4. The CPB imaging method of claim 3, wherein the first asymmetric CPB shape has a ratio of a longest dimension to a narrowest dimension of 1.25 or greater.

5. The CPB imaging method of claim 1, wherein the obtaining the image comprises obtaining a first image and a second image of a sample, wherein the first image and the second image are obtained with the first asymmetric CPB shape and a second asymmetric CPB shape, respectively, wherein the first asymmetric CPB shape is different from the second asymmetric CPB shape, and wherein the final image is obtained by processing the first image and the second image.

6. The CPB imaging method of claim 5, further comprising:
   deconvolving the first image based on the first asymmetric CPB shape; and
   deconvolving the second image based on the second asymmetric CPB shape, wherein the final image is produced based on the deconvolved first image and the deconvolved second image.

7. The CPB imaging method of claim 5, further comprising: combining the
   first image and the second image; and
   deconvolving the combined image to produce the final image.

8. The CPB imaging method of claim 6, wherein the first asymmetric CPB shape is aligned along a first axis and the second asymmetric CPB shape is aligned along a second axis that is different from the first axis.

9. The CPB imaging method of claim 8, wherein the first axis and the second axis are orthogonal.

10. The CPB imaging method of claim 8, wherein the first axis is at an angle of between 45 degrees and 90 degrees with respect to the second axis.

11. The CPB imaging method of claim 5, wherein providing the different CPB magnification along the different axes comprises producing the second asymmetric CPB shape.

12. The charged-particle beam (CPB) imaging method of claim 11, further comprising:
   obtaining a third image of the sample, wherein the third image is obtained with a third beam shape that is different from the first asymmetric CPB shape and the second asymmetric CPB beam shape; and
   deconvolving the first, second, and third images and producing the final image based on the deconvolved first, second, and third images.

13. A CPB imaging system, comprising:
   a CPB optical column operable to produce a first asymmetric CPB that is alignable along a first axis, wherein a shape of the first asymmetric CPB is selected by providing different CPB magnification along different axes;
   a CPB detector situated to produce a first image responsive to the first asymmetric CPB, respectively; and
   a processor coupled to produce a final image based on the first image.

14. The CPB imaging system of claim 13, wherein the processor is configured to produce the final image from the first image and shape of the first asymmetric CPB.

15. The CPB imaging system of claim 13, wherein the processor is operable to produce the final image by deconvolution, and wherein the deconvolution is performed based on one or more of a predetermined pattern region corresponding to a region of interest depicted in the final image, the predetermined pattern region comprising one or more features or a fiducial pattern.

16. The CPB imaging system of claim 13, wherein:
   the CPB optical column is operable to produce the first asymmetric CPB and a second asymmetric CPB that are alignable along the first axis and a second axis, respectively, wherein the first axis is different from the second axis;
   the CPB detector is situated to produce the first image and a second image of a substrate responsive to the first asymmetric CPB and the second asymmetric CPB, respectively; and
   the processor is to produce a final image based on the first image and the second image.

17. The CPB imaging system of claim 16, wherein the processor is configured to produce the final image based on deconvolution.

18. The CPB imaging system of claim 17, wherein the deconvolution is based on based on respective shapes of the first asymmetric CPB and the second asymmetric CPB.

19. The CPB imaging system of claim 17, wherein the processor is operable to combine a deconvolved first image and a deconvolved second image to produce a final image.

20. The CPB imaging system of claim 17, wherein first asymmetric CPB beam is an elongated beam, and the processor is further configured scan the first CPB at a substrate along a direction parallel to a direction of elongation of the first asymmetric CPB.

* * * * *